US010381821B2

United States Patent
Djelassi et al.

(10) Patent No.: US 10,381,821 B2
(45) Date of Patent: Aug. 13, 2019

(54) POWER SWITCH DEVICE

(71) Applicant: Infineon Technologies AG, Neubiberg (DE)

(72) Inventors: Christian Djelassi, Villach (AT); Alexander Mayer, Treffen (AT)

(73) Assignee: Infineon Technologies AG, Neubiberg (DE)

( * ) Notice: Subject to any disclaimer, the term of this patent is extended or adjusted under 35 U.S.C. 154(b) by 309 days.

(21) Appl. No.: 15/276,403

(22) Filed: Sep. 26, 2016

(65) Prior Publication Data

US 2018/0090924 A1  Mar. 29, 2018

(51) Int. Cl.
*H02H 3/06* (2006.01)
*H02H 3/247* (2006.01)
*H03K 17/18* (2006.01)
*H03K 17/284* (2006.01)

(52) U.S. Cl.
CPC .............. *H02H 3/247* (2013.01); *H03K 17/18* (2013.01); *H03K 17/284* (2013.01); *H02H 3/06* (2013.01)

(58) Field of Classification Search
CPC .......... H02H 3/06; H02H 3/247; H03K 17/18; H03K 17/284

USPC ........................................................... 361/92
See application file for complete search history.

(56) References Cited

U.S. PATENT DOCUMENTS

| | | | | |
|---|---|---|---|---|
| 5,307,142 A | * | 4/1994 | Corbett | G06F 11/00 365/154 |
| 5,357,395 A | * | 10/1994 | Bissell | G06F 1/24 361/88 |
| 5,539,910 A | * | 7/1996 | Brueckmann | G06F 1/24 361/92 |
| 2002/0118234 A1 | * | 8/2002 | DeMoor | B41J 29/393 347/5 |
| 2014/0346878 A1 | * | 11/2014 | Umeyama | H03K 3/012 307/52 |
| 2017/0040896 A1 | * | 2/2017 | Akahane | H02M 3/158 |

OTHER PUBLICATIONS

"PROFET® BTS 432 E2, Smart Highside Power Switch," Infineon Technologies Data Sheet, Jan. 26, 2010, 14 pp.

* cited by examiner

*Primary Examiner* — Kevin J Comber
(74) *Attorney, Agent, or Firm* — Shumaker & Sieffert, P.A.

(57) ABSTRACT

Power switch devices and methods are provided where an undervoltage event in a supply voltage is detected. Information regarding the undervoltage event is stored in a memory element. The memory element is supplied by a control signal.

20 Claims, 7 Drawing Sheets

000
POWER SWITCH DEVICE

TECHNICAL FIELD

The present application relates to power switch devices and to corresponding methods.

BACKGROUND

Power switches are conventionally used to couple a load with a supply voltage. In recent years, "smart" power switch devices have been developed which are equipped with one or more diagnostic abilities and protection features, for example against overloads and short circuit events. For example, in such a power switch device as a power switch a MOS transistor may be used, and the switch may be opened (i.e. caused to be non-conducting between terminals of the switch) in case of overload or short circuit events. In case of a short circuit condition (for example caused by a short circuit in a load), an undervoltage may occur. Such an undervoltage condition may lead to an opening of the power switch. However, the undervoltage condition may also cause a "restart" of the power switch, where the power switch is closed again as soon as the undervoltage condition has passed. If the short circuit condition persists, this may lead to a fast toggling between opening and closing the switch, which in turn may lead to a high number of high-energy pulses through the power switch, which may deteriorate or even destroy the power switch.

Therefore, proposals have been made to delay closing of the power switch in such situations, to avoid the aforementioned fast toggling. In conventional solutions, to store information regarding an undervoltage event, a separate supply voltage had to be provided, as the undervoltage otherwise would cause memory elements like latches to lose their stored data and therefore cause the device to "forget" that there was an undervoltage event. Such an additional supply voltage requires an additional pin of a package of the power switch, which is generally undesirable as it causes additional costs.

SUMMARY

According to an embodiment, a switch device is provided, comprising:
a control terminal,
a switch, wherein a control input of the switch is coupled to the control terminal,
a supply voltage terminal,
an undervoltage detection circuit configured to detect an undervoltage of a supply voltage provided to the supply terminal, and
a memory element configured to store information regarding a detected undervoltage, wherein the memory element is coupled to the control terminal to be supplied by a signal at the control terminal.

According to another embodiment, a power switch device is provided, comprising:
a control input terminal,
a supply voltage terminal,
a transistor based power switch configured to selectively couple the supply voltage terminal to an output terminal based on a signal at the control input terminal,
an undervoltage detection circuit configured to detect an undervoltage in the supply voltage at the supply voltage terminal,
a memory element configured to store information regarding a detected undervoltage event, wherein the memory element is supplied by a control signal at the control input terminal, and
a delay circuit configured to delay switching on the power switch based on the information stored in the memory element.

According to yet another embodiment, a method is provided, comprising:
detecting an undervoltage event in a supply voltage of a power switch device, and
storing information indicative of the undervoltage event in a memory element supplied by a control signal, the control signal controlling switching of the power switch device.

The above summary is merely intended to give a brief overview over some aspects of some embodiments and is not to be construed as limiting. In particular, other embodiments may have different features, components or elements than the ones discussed above.

DETAILED DESCRIPTION

Figure 1:
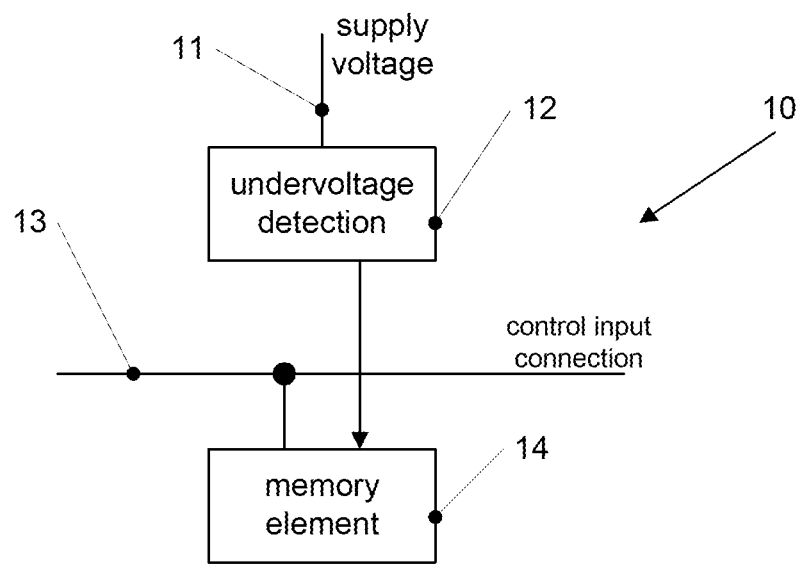
FIG. 1 is a simplified block diagram of some components of a power switch device according to an embodiment.

In the following, various embodiments will be described in detail with reference to the attached drawings. It has to be noted that these embodiments serve as illustrative examples only and are not to be construed as limiting the scope of the present application. For example, while an embodiment may be described as comprising a plurality of features or elements, this serves illustration purposes only, and in other embodiments some of these features or elements may be omitted and/or be replaced by alternative features or elements. Furthermore, in some embodiments additional features or elements in addition to those described herein or shown in the drawings may be provided, for example features or elements conventionally used in power switches, without departing from the scope of the present application. Features or elements from different embodiments may be combined with each other to form further embodiments. Variations are modifications described with respect to one of the embodiments may also be applied to other embodiments.

Any direct electrical connections or couplings shown in the drawings or described herein, i.e. connections or couplings without intervening elements, may also be implemented as indirect connections or couplings, i.e. connections or couplings with one or more additional intervening elements, and vice versa, as long as the general function of the connection or coupling, for example to transmit a certain kind of information or signal or to provide a certain kind of control, is essentially maintained. Connections or couplings may be implemented as wire based connections or couplings or as wireless connections or couplings, or mixtures thereof.

Generally, in the context of the present application power switches may be described as comprising one or more control terminals and two or more load terminals. An opening and closing of the power switch may be controlled by applying one or more signals to at least one of the one or more control terminals. When the power switch is closed (also referred to as on or in an on state), it provides a low ohmic connection between at least two of its load terminals, such that current may flow between the load terminals. When the switch is open (also referred to as off or in an off state), the power switch exhibits a blocking behavior between its load terminals, i.e. is high ohmic, such that essentially no current may flow between the load terminals (with the exception of undesired effects like leakage current etc., which may occur in real devices). For example, one load terminal may be coupled to a load, and another load terminal may be coupled to a supply voltage like a battery voltage, to selectively couple the load with the supply voltage via the power switch. A power switch selectively coupling a load with a positive supply voltage is also referred to as a high side switch, while a power switch coupling a load with a negative supply voltage or ground is also referred to as a low side switch.

In some embodiments, such a power switch may be implemented using a field effect transistor (FET) like a MOS (metal oxide semiconductor) transistor. In this case, the load terminals correspond to source and drain terminals of the MOS transistor, and a control terminal used for opening and closing the power switch corresponds to a gate terminal. In other embodiments, a power switch may be implemented using a bipolar transistor. In such a case, load terminals correspond to emitter and collector terminals, and a control terminal used for opening enclosing the switch may correspond to a base terminal. In other embodiments, insulated gate bipolar transistors (IGBTs) may be used. In such a case, load terminals correspond to emitter and collector terminals, and a control terminal used for opening and closing the switch may correspond to a base terminal. In some a power switches, in addition to a control terminal used for opening enclosing the switch, and the above-mentioned load terminals, further terminals including control terminals may be provided for diagnosis functions.

In some embodiments, as will be described in more detail, an undervoltage condition of supply voltage coupled to the power switch may be monitored. In case an undervoltage condition is detected, an indication that the condition was detected is stored in a memory element like a latch. The memory element is supplied by a voltage at an input terminal coupled to the control terminal of the power switch. In this way, in some embodiments information may be stored independently from the supply voltage at least in a case where a signal at the input terminal indicates an on state of the power switch. The stored information may then be used to introduce a delay after the undervoltage condition has passed.

Turning now to the Figures, FIG. 1 schematically illustrates some components of a power switch device 10 according to an embodiment. FIG. 1 illustrates a supply voltage connection 11 and a control input connection 13 of a power switch device. Via control input connection 13 a power switch (not explicitly shown in FIG. 1), for example a transistor, may be closed or opened, for example to selectively couple the supply voltage to a load. The supply voltage may for example be a battery voltage e.g. in an automotive application, but is not limited thereto.

Power switch device 10 of FIG. 1 further comprises an undervoltage detection circuit 12 configured to detect an undervoltage condition in the supply voltage, for example to detect the supply voltage falling below a predetermined threshold. Furthermore, power switch device 10 comprises a memory element 14, for example a latch, a flip-flop or any other element where at least a one-bit value may be stored. In case undervoltage detection circuit 12 detects an undervoltage in the supply voltage on supply voltage connection 11, it stores a corresponding information in memory element 14, for example a 1-bit flag. Memory element 14 in the embodiment of FIG. 1 is supplied by a voltage on control input connection 13, or, in other words, is supplied by the control voltage for controlling the power switch. In this case, at least when the control voltage is high indicating for example a closing of the power switch, memory element 14 may retain the information stored therein even in case of an undervoltage where the supply voltage drops. It should be noted that storing the information regarding an undervoltage event is in particular of interest when the power switch is to be closed by a signal on control input connection 13, to avoid fast toggling between turning on and turning off the switch, as will be explained later in more detail. In case the power switch is off anyway, such a storing is less critical, such that in some applications it is not harmful if in such a state a voltage of control input connection 13 is such that the information may not necessarily be stored reliably in memory element 14. These and other issues will be explained below in more detail to provide a more thorough understanding.

Figure 2A:
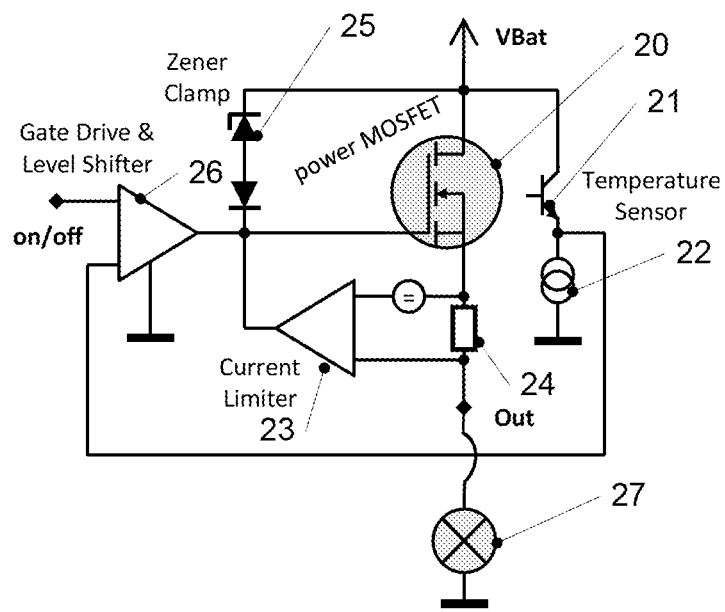
FIG. 2A illustrates a power switch device as an example environment where embodiments may be implemented.

To illustrate an environment where the components of FIG. 1 may be provided, FIG. 2A shows a schematic circuit diagram of a power switch device according to an embodiment.

The power switch device of FIG. 2A comprises a MOSFET 20 acting as a power switch to selectively couple a supply voltage, in this case a battery voltage VBat, with a load. This load in case of FIG. 2A is represented by a light bulb 27, although other types of load may be used. Battery voltage VBat is an example for a supply voltage, for which an undervoltage may be detected as explained with reference to FIG. 1. A gate terminal of power MOSFET 20 is coupled to an output of a gate driver and level shifter 26. Via gate driver and level shifter 26, using an on-off signal the switch may be selectively turned on or off, wherein the on state as explained above corresponds to a state where power MOSFET 20 is closed and an off state corresponds to an open state. The on-off signal is an example for a signal on a control input connection like control input connection 13 of FIG. 1, which may be used to supply a memory element to store information regarding a detected undervoltage condition.

In the embodiment of FIG. 2A, gate driver and level shifter 26 additionally receives a signal from a temperature sensor, which in the example of FIG. 2A is formed by a transistor 21 and a current source 22. Transistor 21 may be a bipolar transistor, pn junctions of which change their behavior with changing temperature. In other embodiments, any other conventional implementation of a temperature sensor may be used.

Furthermore, the power switch device of FIG. 2A comprises a current limiter 23. Current limiter 23 receives a measure of a current flowing via the load terminals of power MOSFET 20 by measuring a voltage drop across a sense resistor 24 and may control the gate terminal of power MOSFET 22 prevent an overcurrent. Other circuitry may also be provided, for example shunt resistors for current limitation. Furthermore, a Zener diode clamp 25 is provided as an overvoltage protection. It should be noted that the shown power switch devices serve only illustrative purposes, and in other power switch devices for example only some of the features or elements shown in FIG. 2A and/or alternative features or elements may be provided.

When a load coupled to the power switch device has a low ohmic, short circuit-like behavior, this may lead to a drop of a supply voltage and therefore to an undervoltage. To further illustrate this, FIG. 2B shows a simple equivalent circuit of a power switch device and associated load.

Figure 2B:
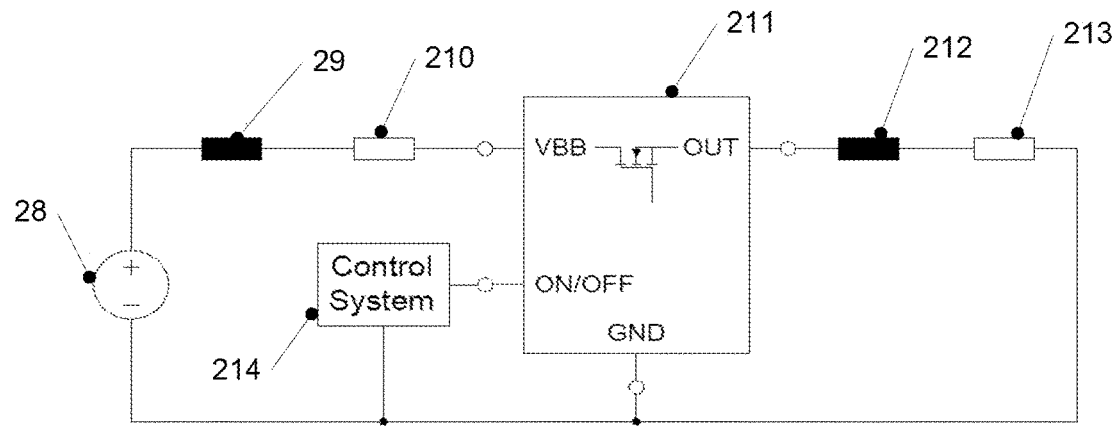
FIG. 2B is an example circuit diagram illustrating a short circuit condition in which embodiments may be applied.

FIG. 2B schematically illustrates a power switch 211 together with a control system 214 controlling opening and closing of the switch. Power switch 211 serves to selectively couple a load to a supply voltage source like a battery voltage. The voltage source in FIG. 2B is represented by an ideal voltage source 28 (i.e. without inductance or resistance) together with a supply inductance 29 and a supply resistance 210. These are no discrete elements, but represent inductivity and resistance inherent in a real world voltage source (in contrast to ideal voltage source 28). The load in FIG. 2B is represented by an inductance 212 and a resistor 213. In case of a short circuit, resistor 213 and possibly also inductance 212 have very low resistance and inductivity values, respectively, which may cause an undervoltage condition, as voltage source 28 no longer can maintain its nominal voltage.

This undervoltage condition may cause the switch 211 to be opened. This, in turn, after some time remedies the undervoltage condition and possible overcurrent associated with the short circuit condition, which causes the switch to close again as long as a corresponding control signal for closing switch 211 is applied by control system 214.

Figure 2D:
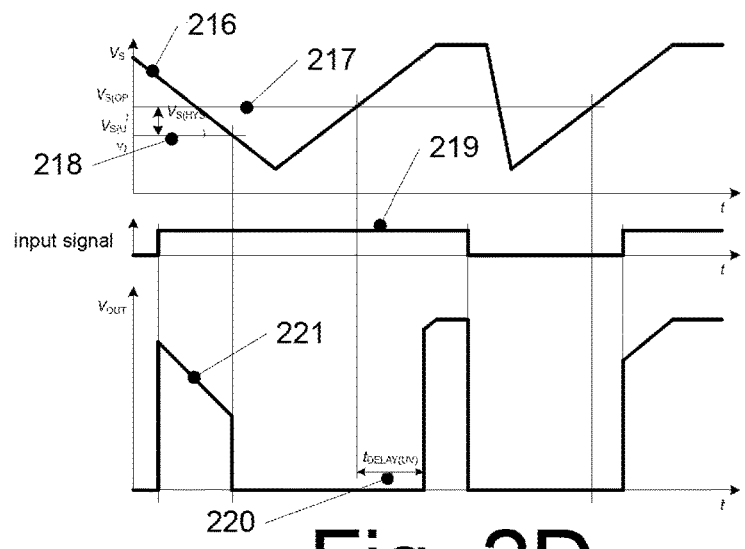
FIG. 2D illustrates a curve illustrating the provision of a delay in some embodiments after an undervoltage event.
Figure 2C:
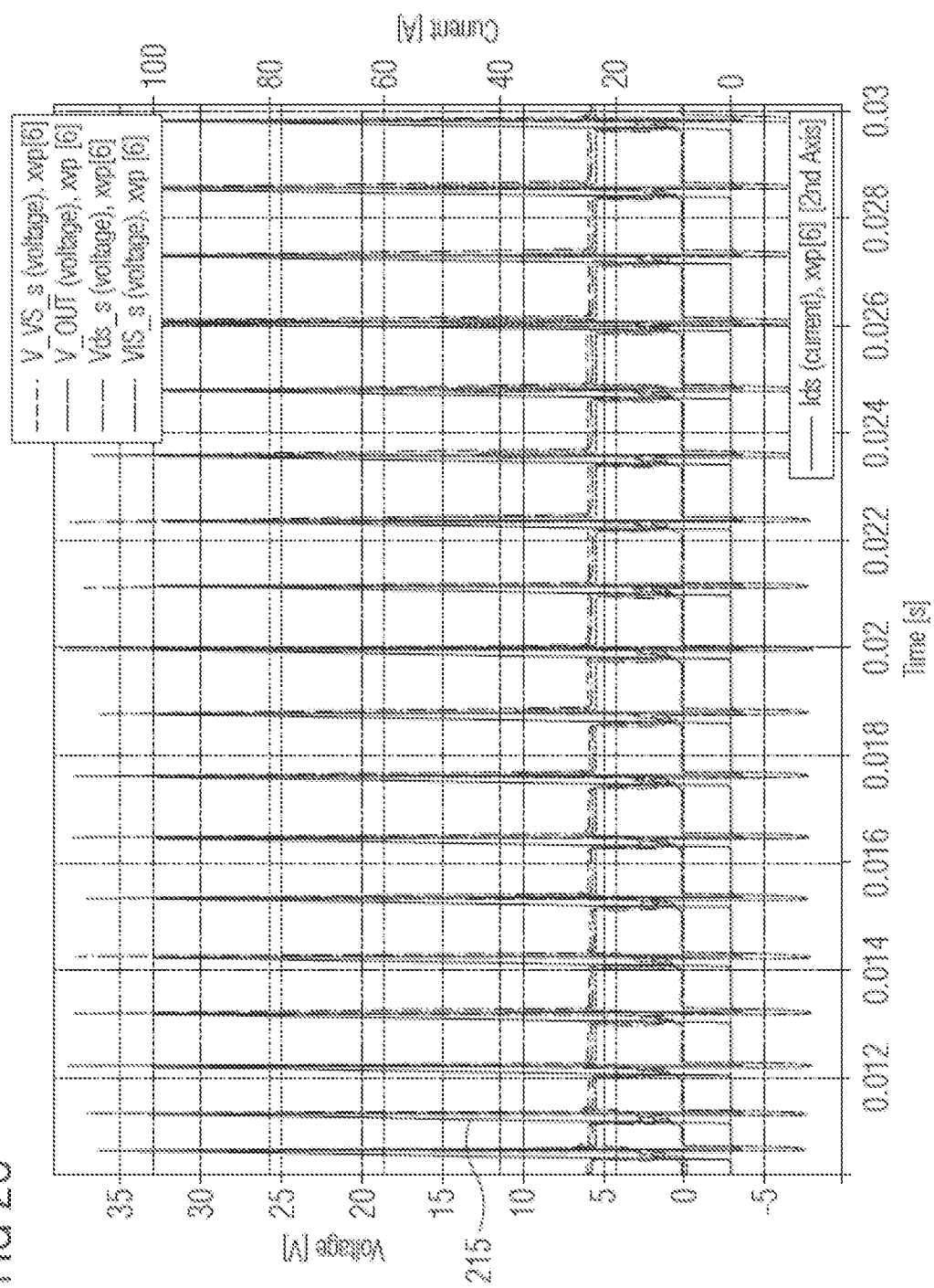
FIG. 2C shows a short circuit behavior of a power switch device for comparison purposes.

The effect of such a situation without any further measures like the circuit of FIG. 1 is shown in FIG. 2C. Here, curve 215 is a current in Ampère, and other curves show voltages at the switch. As can be seen, a fast toggling between turn-on and turn-off occurs with high currents and high voltages, or, in other words, a high energy of current pulses. This may exceed specifications for the switch, ultimately destroying switch 211 of FIG. 2B (for example power MOSFET 20 of FIG. 2) at least adversely affecting the functioning of the switch.

To avoid such a situation, in embodiments, when in a memory element like memory element 14 an information is stored that an undervoltage was present, a delay is introduced before switching the switch on again. This delay in embodiments only needs to be introduced when a control signal to the switch is in an on-state when the undervoltage event occurred, as with an off-state the switch is open anyway and therefore no fast toggling occurs. This is illustrated in some more detail in FIG. 2D.

In FIG. 2D, a curve 216 illustrates an example behavior of a supply voltage like the supply voltage on connection 11 of FIG. 1, the battery voltage VBat in FIG. 2A or the voltage supplied by supply voltage 28 in a power switch device according to an embodiment with a load essentially corresponding to a short circuit, as explained above. A curve 219 illustrates an external input signal which controls the switch. When input signal 219 goes high, the switch closes, and due to the short circuit the supply voltage 216 and the voltage output by the switch to a load according to curve 221 drops. When the supply voltage drops below a threshold 218, an undervoltage is detected, and the switch is turned off. In this case, the output voltage according to curve 221 drops to 0. Following this switching off, after some time the supply voltage starts to rise again.

When supply voltage 216 reaches a further threshold 217, normal operation for the switch is resumed, i.e. the emergency turning off due to undervoltage is terminated. Further threshold 217 is higher than threshold 218 to provide some hysteresis. As input signal 219 still is high and therefore indicates that the switch should be closed (in an undervoltage condition, closing (on-state) cannot be guaranteed as the supply voltage may be too low, which may lead to a control signal for a switch which is generated internally based on the input signal which has a too small voltage to close the switch), without further measures the switch may close again. However, according to embodiments information that a voltage was detected previously is stored in a memory element like memory element 14, and based on this information a delay 220, for example between 1 and 100 ms, for example between 2 and 20 ms, for example about 5 ms, is introduced before the switch is closed again. When the switch is closed again, a voltage is output again according to curve 221.

Then, in the example of FIG. 2D the switch is closed by input signal 219. Following this, another undervoltage event occurs in the example of FIG. 2D, with the supply voltage 216 rising again thereafter. As this undervoltage event happens when the switch was off anyway, no information regarding undervoltage detection is stored in some embodiments. Therefore, when signal 219 signals the switch to close, the transistor is closed without delay, although in other embodiments a short delay (close to 0, for example about 15 μs, i.e. significantly smaller than delay 220) may be introduced. It should be noted that the signals of FIG. 2B and their waveforms serve only for further illustration and are not to be construed as limiting, as waveforms in actual implementations and situations may differ.

Figure 3:
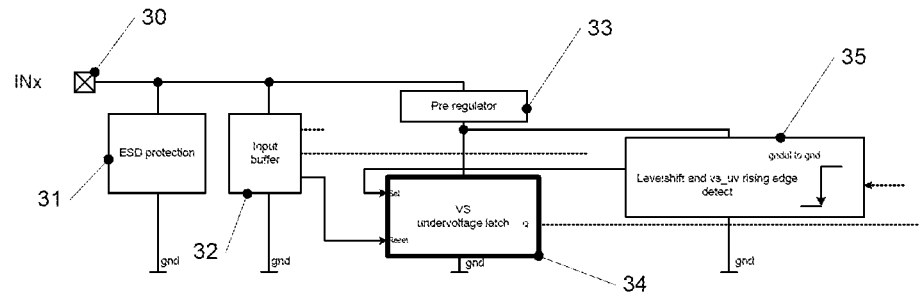
FIG. 3 illustrates a block diagram of some components of a power switch device according to an embodiment.

More detailed embodiments will now be described referring to FIGS. 3-7. FIG. 3 is a block diagram illustrating a part of a power switch according to an embodiment. In particular, FIG. 3 illustrates parts of a power switch serving to store information regarding an undervoltage event.

The embodiment of FIG. 3 comprises an input terminal 3 for receiving an input signal to control a switch. It should be noted that in some embodiments, a plurality of so-called channels with a plurality of switches may be provided in a single power switch device. The designation INx in FIG. 3 indicates that the circuit paths shown are for a channel number x and may be provided several times for several channels.

Input terminal 30 may be used to control a switch transistor of the switch device of FIG. 3 (not shown) to open or close by applying a corresponding control signal to input terminal 30. An ESD (electrostatic discharge) protection circuit 31 is coupled to input terminal 30 to provide ESD protection. ESD protection 31 may be implemented in any conventional manner, for example using shunt diodes or any other conventional ESD protection circuitry, to deviate an ESD event at input terminal 32 ground.

Furthermore, the circuit of FIG. 3 comprises an input buffer 32 receiving the input signal INx from terminal 30 and providing the input signal to further circuit parts (not shown in FIG. 3) as indicated by dashed lines inter alia to control the switch transistor. Furthermore, input buffer 32 is coupled to a reset input of a latch 34 serving as a memory element. Therefore, the undervoltage latch is reset when the input signal goes to high, such that for each switching on the switch based on the input signal after a switching off (also referred to as switching cycle) events stored from previous switching cycles are removed from latch 34. This in particular prevents setting off the latch during normal start-up of the system triggered by input signal INx.

The circuit of FIG. 3 furthermore comprises a pre-regulator 33 which is a voltage regulation circuit that converts a voltage provided at input terminal 30 to a regulated supply voltage for latch 34. To this end, the pre-regulator 33 may for example comprise a DC/DC converter to provide a desired voltage level. For example, typical voltages for control signal applied to terminal 30 may be in the range of 2 to 5 V, whereas latch 34 may for example require a stable supply voltage of 1.3 V, and pre-regulator 33 provides such a supply voltage. It should be noted that a current consumption of latch 34 may be low, e.g. below 10 µA or below 5 µA, for example about 2 µA.

Furthermore, the circuit of FIG. 3 comprises a level shift and rising edge detection circuit 35. Level shift and rising edge detect circuit 35 receives a signal from an undervoltage detection circuit (not shown in FIG. 3) and detects a rising edge indicating an undervoltage in this signal. In other embodiments, other signal features than rising edges may be indicative of an undervoltage.

Additionally, level shift and rising edge detect circuit 35 performs a level shifting. This level shifting is performed in some embodiments as a voltage domain of the supply voltage in which the undervoltage is detected uses different voltage levels as the circuit parts shown in FIG. 3, in particular latch 34, which is supplied via a voltage at terminal 30. The level shifting serves to convert the voltage between these domains. The voltage domain of these aforementioned supply voltage is also referred to as gnd_ul, as in some embodiments a floating ground is used in this domain, while the voltage domain of the components shown in FIG. 3 is also referred to as gnd domain in the Figures or as input voltage domain herein. In embodiments where the same or similar voltages are used in both domains, level shifting may be omitted.

An output of level shift and rising edge detect circuit 35 is coupled to a set input of latch 34, such as to set the latch (e.g. store a logic 1) when an undervoltage is detected. This stored logic 1 therefore corresponds to an information indicative of an undervoltage event. It should be noted that in other embodiments the logic may be reversed, and a logic 0 may be indicative of an undervoltage event. An output of latch 34 as indicated by dashed lines then is e.g. coupled to a delay circuit introducing a delay in case of an undervoltage event, as explained with reference to FIG. 2, or otherwise used.

Figure 4:
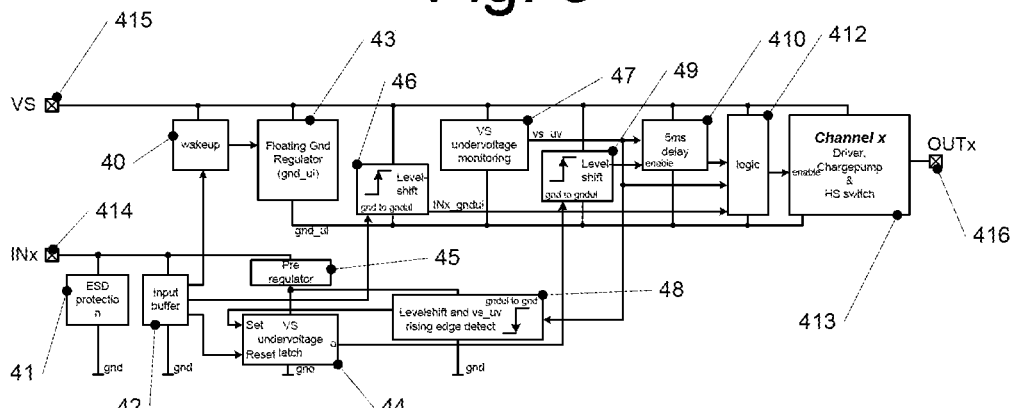
FIG. 4 shows a block diagram of a power switch device according to an embodiment.

FIG. 4 is a block diagram of a power switch device according to an embodiment. FIG. 4 illustrates one of a plurality of channels (channel number x), and one or more such channels may be present in a power switch device according to an embodiment.

To avoid repetitions, elements of FIG. 4 already described with respect to FIG. 3 will only briefly be described again, and any explanations made with respect to FIG. 3 also apply to FIG. 4.

In particular, the embodiment of FIG. 4 comprises an input terminal 414 for receiving a control signal, similar to input terminal 30, an ESD protection circuit 41 similar to ESD protection circuit 32, an input buffer 42 similar to input buffer 32, a pre-regulator 45 similar to pre-regulator 33, a latch 44 similar to latch 34, and a level shift and rising edge detection circuit 48 similar to circuit 35 of FIG. 3.

Furthermore, the embodiment of FIG. 4 comprises a supply voltage terminal 415 to receive a supply voltage VS like a battery voltage and an output terminal 416 to output a voltage signal OUTx. When channel x shown in FIG. 4 of the power switch device is closed, input terminal 415 is coupled to output terminal 416, such as to supply a load coupled to output terminal 416 with the supply voltage VS coupled to supply voltage terminal 415. Furthermore, via supply voltage terminal 415 components 40, 43, 46, 47, 49, 410, 412 and 413 described in more detail below are supplied with power, i.e. with supply voltage VS.

The embodiment of FIG. 4 comprises a wake-up circuit 40. Wake-up circuit 40 serves to power up the shown channel of the power switch device of FIG. 4 in a controlled manner when a signal is applied to input terminal 414. To this end, wake-up circuit 40 receives a signal from input buffer 42 as illustrated in FIG. 4. In particular, wake-up circuit 40 may serve for a controlled switching on of the switch device.

The circuit of FIG. 4 further comprises a floating ground regulator circuit 43 generating the floating ground gnd_ul to which components 46, 47, 49, 410, 412 and 413 are coupled as shown in FIG. 4.

Furthermore, the embodiment of FIG. 4 comprises an undervoltage monitoring circuit 47 to detect an undervoltage in a supply voltage VS supplied to terminal 415. To this end, for example undervoltage monitoring circuit 47 may comprise one or more comparators comparing the supply voltage or a voltage derived therefrom with a reference value, or any other suitable comparison. An output of undervoltage monitoring circuit 47 is provided to a delay circuit 410, to a logic circuit 412 and to level shift and rising edge detect circuit 48. In case undervoltage monitoring circuit 47 detects an undervoltage, an output vs_uv of undervoltage monitoring circuit 47 in the embodiment of FIG. 4 goes from low to high, which corresponds to a rising edge which is detected by level shift and rising edge detect circuit 48. This in turn causes a logic 1 to be stored in latch 44.

An output of latch 44 is coupled to a level shifter 49, which changes the output level of latch 44 to a corresponding level in the domain of supply voltage VS. An output of level shifter 49 is provided to an enable input of delay circuit 410, thus enabling a delay. An output of delay circuit 410 is coupled to logic circuit 412.

Furthermore, an output of input buffer 42 is coupled to logic 412 via a level shifter 46, which level-shifts an output signal of input buffer 42 to a corresponding signal in the domain of supply voltage VS.

Logic circuit 412 then controls circuit 413 which includes the actual switch (high-side switch in this example) realised for example by a power switch transistor, and associated drivers and charge pumps for driving the transistor. Without an undervoltage event, logic circuit 412 controls circuit 413 based on the input signal INx received at terminal 414 and provided to logic circuit 412 via input buffer 42 and level shifter 46 to open and close the switch according to input signal INx. In case an undervoltage is detected, logic 412 opens the switch. If the undervoltage condition then remains and an undervoltage event is stored in latch 44, based on delay circuit 410 a switching on again of the switch is delayed, for example by 5 ms in the example of FIG. 4, although other delay times may also be used.

It should be noted that in the embodiment of FIG. 4 the undervoltage event may be stored only if the signal INx is high indicating a switching on of the switch, as only in this case latch 44 is supplied with power. This leads to the behavior as explained with reference to FIG. 2D, i.e. the delay is introduced only in case the input signal INx indicates that the switch is to be closed.

Figure 5:
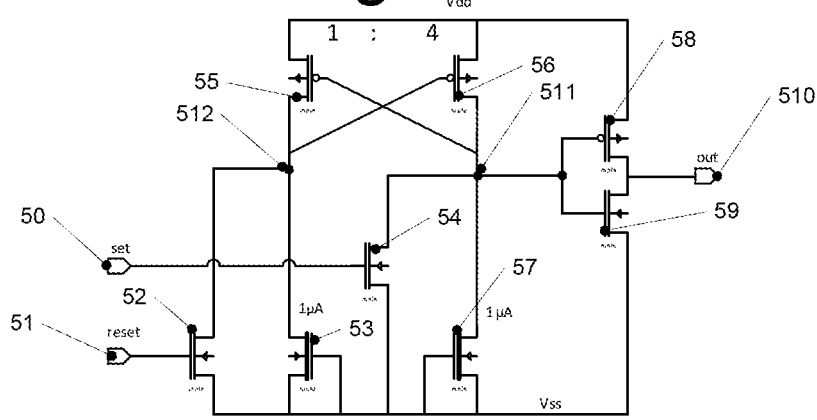
FIG. 5 illustrates a latch usable as a memory element in some embodiments.

FIG. 5 illustrates a non-limiting implementation example of a latch circuit, which may be used as memory element 14 of FIG. 1, latch 34 of FIG. 3 or latch 44 of FIG. 4 (or as latches in the embodiment described further below referring to FIGS. 6 and 7). Other embodiments of latches or other memory elements like flip-flop based memory elements may also be used.

The latch circuit of FIG. 5 comprises a set input 50, a reset input 51 and an output 510. A core portion of the latch comprises a pair of cross coupled PMOS transistors 55, 56 coupled with a pair of NMOS transistors 53, 57 as shown in FIG. 5. The latch is set by applying a corresponding signal to set input 50, which via an NMOS transistor 54 sets node 511 to logic low (coupling node 511 to a low voltage like VSS via transistor 54). This state is maintained through the cross-coupling of transistor 55, 56 until a reset is applied to reset terminal 51, which draws a node 512 to the negative supply voltage via transistor 52 and therefore node 511 to the positive voltage, for example VDD. In case of use in the embodiment of FIG. 4, VSS corresponds to ground, and VDD corresponds to the voltage supplied by pre-regulator 45.

An output inverter formed by a PMOS transistor 58 and an NMOS transistor 59 then outputs a corresponding signal level at output 510.

The latch may be designed in an asymmetric manner, for example by designing transistor 56 bigger than transistor 55 (for example with a ratio of 4:1 as indicated in FIG. 5, although other ratios are equally possible). This at start-up causes node 511 to assume a voltage at or near the positive voltage, leading to an output of logic 0 (corresponding to no undervoltage event stored) in the embodiment of FIG. 5. In other words, in this way at start-up of the system the latch assumes a defined value. In other embodiments, a symmetric design together with circuitry to set the output latch to a defined state may be used instead of an asymmetric latch.

Figure 6:
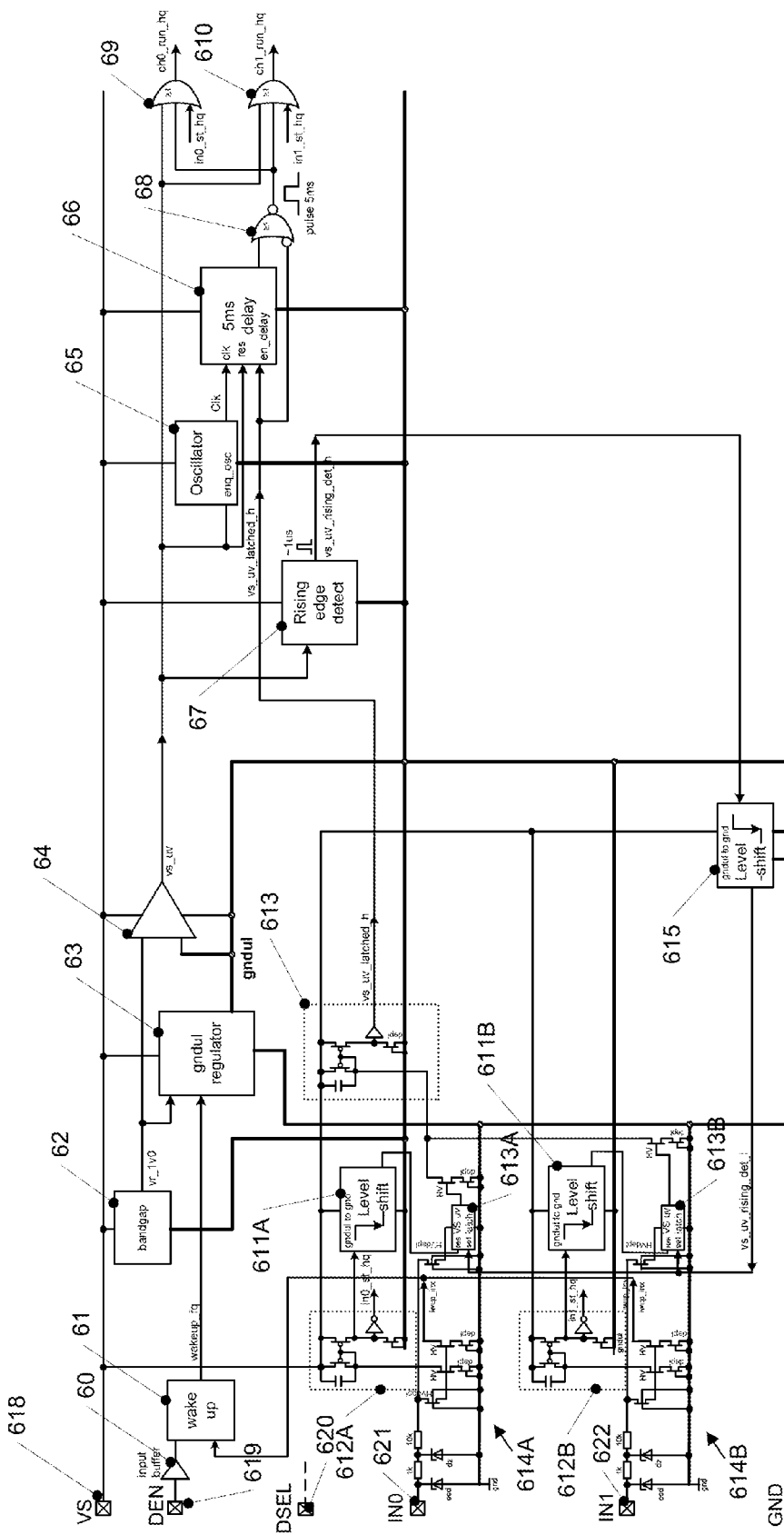
FIG. 6 is a detailed block diagram of a power switch device according to an embodiment.

FIG. 6 shows a more detailed block and circuit diagram of a power switch device according to an embodiment. The embodiment of FIG. 6 will be described referring to previously described embodiments to avoid repetitions of descriptions of similar or like parts. This is not to be construed as indicating that these parts have to be implemented in exactly the same manner, but merely that they perform similar functions, and therefore the description need not be repeated in detail.

The embodiment of FIG. 6 is an example for a power switch device with two channels, channel 0 and channel 1. In other embodiments, only a single channel or more than two channels may be used.

The embodiment of FIG. 6 comprises a supply voltage terminal 618 for receiving a supply voltage VS, corresponding for example to terminal 415 of FIG. 4. Furthermore, the embodiment of FIG. 6 comprises a ground terminal 623 to be coupled to ground (GND).

The device of FIG. 6 comprises a first input terminal 621 for a first channel receiving a control signal IN0, and a second control terminal 622 for a second channel for receiving a second control signal IN1. These terminals for their respective channel each correspond to terminal 30 of FIG. 3 or terminal 414 of FIG. 4.

Furthermore, the embodiment of FIG. 6 comprises a diagnosis enable input 619 and a diagnostic select input 624 receiving signals DEN and DSEL, respectively. These signals may be used for conventional diagnosis functions, for example to cause the device to output certain diagnosis information selected by signal DSEL, wherein a switching from normal operation to diagnosis operation is enabled by signal DEN. Such diagnosis functions are also provided in conventional power switch devices, and any conventional implementations may be used also in embodiments described herein.

For channel 0, the embodiment of FIG. 6 comprises input circuitry generally labeled 614A, and for channel 1, input circuitry generally labeled 614B. Input circuitries 614A, 614B each comprise ESD protection circuitry implemented by ESD protection diodes and input buffering circuitry as shown. Furthermore, further input circuitry 612A is provided for the first channel and further input circuitry 612B for the second channel. Further input circuitries 612A, 612B each perform level shifting function to the gnd_ul domain and output a signal in0_st_hq for channel 0 and EN and in1_st_hq for channel 1, respectively, which is used to control switching of the respective switch through a logic as will be described further below. Further, the embodiment of FIG. 6 comprises a latch 613A for channel 0 and a latch 613B for channel 1, which latches serve for storing undervoltage information, as described for example for latch 34 of FIG. 3 and latch 44 of FIG. 4. A reset input of latch 613A is coupled to further input circuitry 612A via a level shifter 611A transferring the output of circuitry 612A to the gnd domain. In this way, latch 613A may be reset by input signal IN0, as already described with respect to FIG. 4. In a similar manner, latch 613B for channel 1 is coupled to further input circuitry 612B via a level shifter 611B.

Input circuitry 614A and 614B is furthermore coupled to an input of a wake-up circuit 61. Wake-up circuit 61 is coupled to terminal 619 via an input buffer 60. Wake-up circuit 61, as has been described for wake-up circuit 40 of FIG. 4, activates the device of FIG. 6 when a signal is applied at one of terminals 621, 622 or at terminal 619 by activating a ground regulator 63 corresponding to floating ground regulator 43 of FIG. 4. Regulator 36 in particular provides a floating ground gnd_ul as illustrated in FIG. 6.

Furthermore, the device of FIG. 6 comprises a bandgap reference circuit 62 providing a bandgap reference voltage vr_1v0 to regulator 63 and a comparator 64 which will be described later. Bandgap reference circuit 62 may be implemented in any conventional manner known for bandgap reference circuits.

Comparator 64 serves for undervoltage monitoring and in this implementation compares the bandgap reference voltage vr_1v0 output by bandgap reference circuit 62 to floating ground gnd_ul regulated by regulator 63, and outputs a signal vs_uv based on the comparison. In case of an undervoltage, signal vs_uv increases, which is detected by a rising edge detection circuit 67 in FIG. 7. Furthermore, an output of comparator 64 is provided to an oscillator 65 and a delay circuit 66.

Rising edge detection circuit 67 detects rising edges in signal vs_uv and outputs a signal vs_uv_rising_det_n in case of a rising edge being detected, for example in form of a pulse having a duration of approximately 1 µs, although other kinds of signals may also be used. This signal is provided to set inputs of latches 613A, 613B via a level shifter 615, thus storing information regarding a detected undervoltage event at least when the respective signal IN0, IN1 is high supplying the respective latch with power and indicating that the corresponding switch is to be closed.

Oscillator 65 is enabled when an undervoltage is detected and clocks delay circuit 66 by providing a clock signal Clk and a clock input clk thereof. Signal vs_uv from comparator 65 furthermore serves for resetting delay circuit 66. Delay circuit 66 provides a delay based on clock signal Clk, for example a delay of 5 ms, even if in other embodiments other delay durations may be used. An output of delay circuit 66 is provided to logic 68 to 610, which is an implementation example for logic circuit 412 of FIG. 4. Other implementations for logic circuits may also be used.

In particular, the logic in the example of FIG. 6 comprises a NOR gate 68 with an inverted input, the inverted input receiving output signals from latches 613A, 613B via a level shifter 613, which signal is also set to an enable input of delay circuit 66. A non-inverted input of NOR gate 68 receives an output of delay circuit 66, which, when the delay circuit is activated (undervoltage event stored in latch 613A or 613B) generates a pulse with a duration of 5 ms. The logic further comprises OR gates 69, 610 A first input of each of OR gates 69, 610 receives the output signal from comparator 64. A second input receives the output signal from gate 68. A third input of OR gate 69 receives signal in0_st_hq from circuitry 612A, and a third input of OR gate 610 receives signal in1_st_hq from circuitry 612B. OR Gate 69 outputs a signal ch0_run_hq for channel number 0 to a gate driver of a first channel. For example, the signal may correspond to the signal on/off of FIG. 2A for the first channel driving a transistor like transistor 20. Likewise, OR gate 610 outputs a signal ch1_run_hq for channel 1, which may be provided, wherein the driver and switch transistor for channel 1 also may be implemented as shown in FIG. 2. Note that in the specific embodiment shown, ch0_run_hq, ch1_run_hq, in0_st_hq, in1_st_hq are active low, i.e. a logic 0 indicates that the respective channel is to be closed (put to an on-state). Therefore, if one of the signals applied to a respective OR-gate 69, 610 is high, the output signal ch0_run_hq or ch1_run_hq, respectively, is high, and the respective switch in not closed.

Therefore, in the embodiment of FIG. 6, for two channels undervoltage events may be stored in respective latches, the latches being powered by control signals IN0 and IN1, respectively, such that the information is available after the undervoltage event and may be used to delay turning on of a respective switch.

Figure 7:
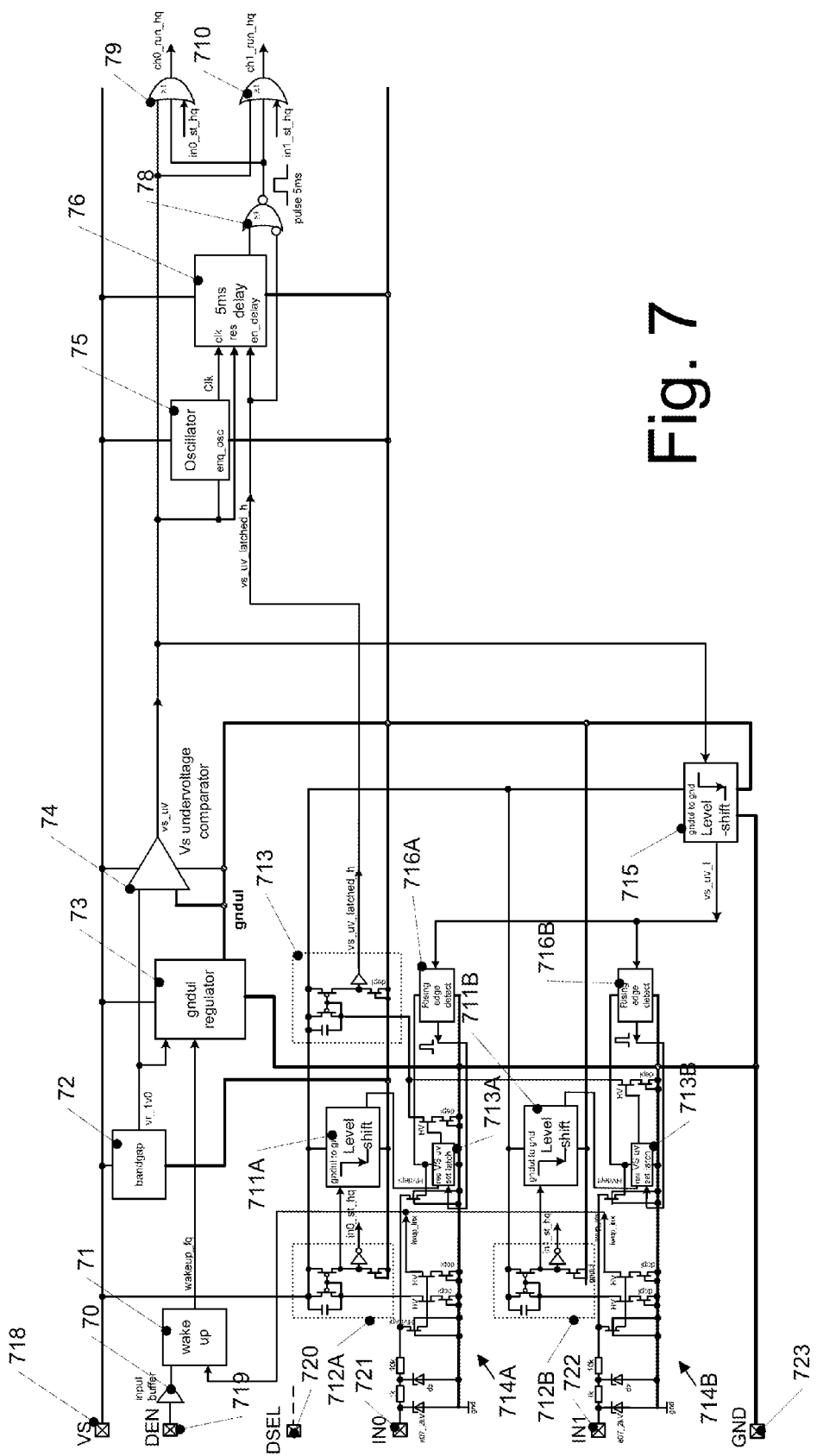
FIG. 7 is a detailed block diagram of a power switch device according to a further embodiment.

FIG. 7 illustrates a further embodiment, which is a variation of the embodiment of FIG. 6. In FIG. 7, elements corresponding to the embodiment of FIG. 6 bear the same reference numeral with the first digit increased by one (i.e. 70 of FIG. 7 corresponds to 60 of FIG. 6, 71 of FIG. 7 corresponds to 61 FIG. 6, . . . , 713 of FIG. 7 corresponds to 613 of FIG. 6 . . . etc.), and these elements will not be described again. Instead, in the following the differences between FIG. 7 and FIG. 6 will be described.

Compared to FIG. 6, in FIG. 7 rising edge detecting circuit 67 which operates in the VS domain (supplied by VS and gnd_ul) is omitted. Instead, two rising edge detection circuits 716A (for channel 0) and 716B (for channel 1) are provided which operate in the input domain, i.e. supplied by a signal IN0, IN1, respectively, and ground. Rising edge detection circuits 716A, 716B each receive the level shifted version of the output of comparator 74 from level shifter 715. Therefore, in FIG. 6 the edge detection (by circuit 67) occurs before level shifting (by circuit 615), whereas in FIG. 7 rising edge detection (circuits 716A, 716B) occurs after level shifting (by circuit 715).

Figure 8:
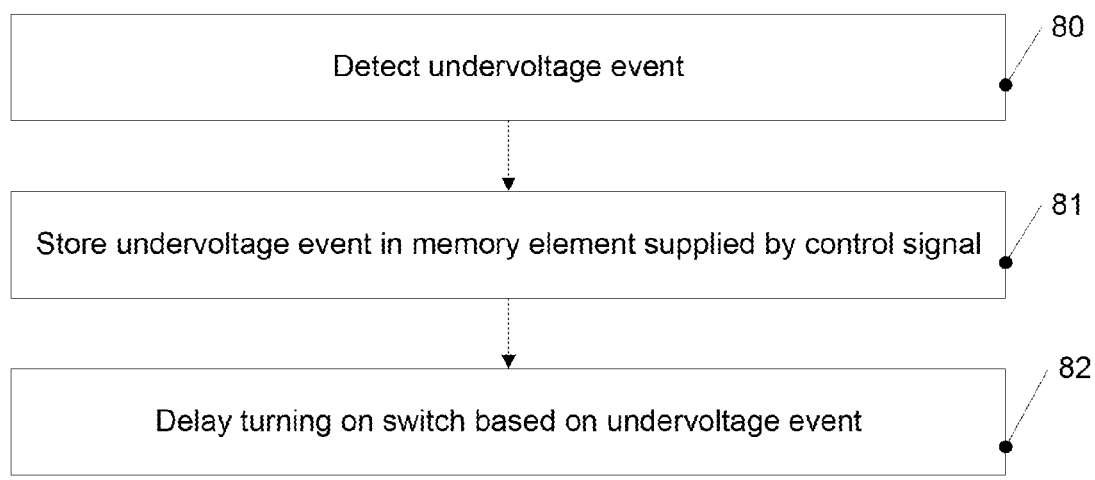
FIG. 8 is a flowchart illustrating a method according to an embodiment.

FIG. 8 illustrates a method according to an embodiment. While the method of FIG. 8 is illustrated and described as a series of acts or events, the order in which these acts or events are described is not to be construed as limiting. Moreover, for ease of explanation the method of FIG. 8 will be described referring to the embodiments of FIGS. 1-7. Nevertheless, the method of FIG. 8 may also be implemented in other devices than the ones illustrated in FIGS. 1 to 7.

At 80, the method comprises detecting an undervoltage event in a supply voltage, like voltage VS described previously. Detecting the supply voltage may involve the use of an undervoltage detection circuit, which may comprise a comparator like comparator 64 or 74 of FIGS. 6 and 7 and an edge detection, as described previously.

At 81, the method comprises storing information indicating the undervoltage event in a memory element. The memory element is supplied by a control signal used for opening and closing a switch. The memory element may be a latch. For example, the memory element may be implemented and supplied as described referring to FIGS. 1 to 7.

At 82, the method comprises delaying the turning on of a switch based on the information regarding the undervoltage event stored in the memory, for example by a delay circuit as described previously.

According to some embodiments, implementation in accordance with the following examples are provided:

Example 1

A switch device, comprising:
a control terminal,
a switch, wherein a control input of the switch is coupled to the control terminal,
a supply voltage terminal,
an undervoltage detection circuit configured to detect an undervoltage of a supply voltage provided to the supply terminal, and
a memory element configured to store information regarding a detected undervoltage, wherein the memory element is coupled to the control terminal to be supplied by a signal at the control terminal.

Example 2

The device of example 1, wherein the memory element comprises a latch.

Example 3

The device of example 1 or 2, wherein the undervoltage detection circuit comprises comparator and a rising edge detection circuit coupled to an output of the comparator.

Example 4

The device of any one of examples 1 to 3, further comprising a level shifter coupled between the undervoltage detection circuit and the memory element.

Example 5

The device of any one of examples 1 to 4, further comprising a voltage regulation circuit coupled between the input terminal and the memory element.

Example 6

The device of any one of examples 1 to 5, further comprising a delay circuit configured to delay switching on of the switch based on the information stored in the memory element.

Example 7

The device of example 6, wherein the delay is between 1 and 100 ms, e.g. between 2 and 20 ms.

Example 8

The device of example 6 or 7, wherein the delay circuit comprises an oscillator.

Example 9

The device of any one of examples 1 to 8, wherein the undervoltage detection circuit comprises an edge detection circuit and a further circuit which provides a signal to the edge detection circuit, and further comprising a level shifter arranged between the further circuit and the edge detection circuit or downstream of the edge detection circuit.

Example 10

The device of example 9, wherein the further circuit comprises a comparator.

Example 11

A power switch device, comprising:
a control input terminal,
a supply voltage terminal,
a transistor based power switch configured to selectively couple the supply voltage terminal to an output terminal based on a signal at the control input terminal,
an undervoltage detection circuit configured to detect an undervoltage in the supply voltage at the supply voltage terminal,
a memory element configured to store information regarding a detected undervoltage event, wherein the memory element is supplied by a control signal at the control input terminal, and
a delay circuit configured to delay switching on the power switch based on the information stored in the memory element.

Example 12

The device of example 11, wherein the memory element comprises a latch, for example an assymetric latch.

Example 13

The device of example 11 or 12, wherein the device comprises a first voltage domain associated with the supply voltage and a second voltage domain associated with the control signal at the control input terminal, the device further comprising at least one level shifter to convert a voltage between the first voltage domain and the second voltage domain.

Example 14

The device of example 13, wherein the first voltage domain is associated with a floating ground, and the second voltage domain is associated with ground.

Example 15

The device of example 14, further comprising a bandgap reference circuit, wherein the undervoltage detection circuit comprises a comparator configured to compare a bandgap voltage reference output by the bandgap reference circuit with the floating ground.

Example 16

The device of example 15, wherein the undervoltage detection circuit further comprises an edge detection circuit configured to detect a rising edge in an output signal of the comparator.

Example 17

A method, comprising:
detecting an undervoltage event in a supply voltage of a power switch device, and
storing information indicative of the undervoltage event in a memory element supplied by a control signal, the control signal controlling switching of the power switch device.

Example 18

The method of example 17, further comprising delaying closing the power switch device based on the information stored in the memory element.

Example 19

The method of example 17 or 18, further comprising resetting the memory element based on the control signal.

Example 20

The device of any one of examples 17 to 19, wherein detecting the undervoltage event comprises comparing a floating ground derived from the supply voltage to a bandgap reference voltage derived from the supply voltage.

As can be seen from the above explanations, a plurality of modifications and variations are possible, and therefore the above-described embodiments are not to be construed as limiting.

What is claimed is:
1. A switch device, comprising:
a control terminal,
a switch, wherein a control input of the switch is coupled to the control terminal,
a supply voltage terminal,
an undervoltage detection circuit configured to detect an undervoltage of a supply voltage provided to the supply voltage terminal, and
a memory element configured to store information regarding a detected undervoltage, wherein the memory ele- ment is coupled to the control terminal such that power is supplied to the memory element by a signal at the control terminal.

2. The device of claim 1, wherein the memory element comprises a latch.

3. The device of claim 1, wherein the undervoltage detection circuit comprises a comparator and a rising edge detection circuit coupled to an output of the comparator.

4. The device of claim 1, further comprising a level shifter coupled between the undervoltage detection circuit and the memory element.

5. The device of claim 1, further comprising a voltage regulation circuit coupled between the control terminal and the memory element.

6. The device of claim 1, further comprising a delay circuit configured to delay switching on of the switch based on the information stored in the memory element.

7. The device of claim 6, wherein the delay is between 1 and 100 ms.

8. The device of claim 6, wherein the delay circuit comprises an oscillator.

9. The device of claim 1, wherein the undervoltage detection circuit comprises an edge detection circuit and a further circuit which provides a signal to the edge detection circuit, and further comprising a level shifter arranged between the further circuit and the edge detection circuit or downstream of the edge detection circuit.

10. The device of claim 9, wherein the further circuit comprises a comparator.

11. A power switch device, comprising:
a control input terminal,
a supply voltage terminal,
a transistor based power switch configured to selectively couple the supply voltage terminal to an output terminal based on a signal at the control input terminal,
an undervoltage detection circuit configured to detect an undervoltage in a supply voltage at the supply voltage terminal,
a memory element configured to store information regarding a detected undervoltage event, wherein the memory element is coupled to the control input terminal such that power is supplied to the memory element by a control signal at the control input terminal, and
a delay circuit configured to delay switching on the power switch based on the information stored in the memory element.

12. The device of claim 11, wherein the memory element comprises an asymmetric latch.

13. The device of claim 11, wherein the device comprises a first voltage domain associated with the supply voltage and a second voltage domain associated with the control signal at the control input terminal, the device further comprising at least one level shifter to convert a voltage between the first voltage domain and the second voltage domain.

14. The device of claim 13, wherein the first voltage domain is associated with a floating ground, and the second voltage domain is associated with ground.

15. The device of claim 14, further comprising a bandgap reference circuit, wherein the undervoltage detection circuit comprises a comparator configured to compare a bandgap voltage reference output by the bandgap reference circuit with the floating ground.

16. The device of claim 15, wherein the undervoltage detection circuit further comprises an edge detection circuit configured to detect a rising edge in an output signal of the comparator.

17. A method, comprising:
detecting an undervoltage event in a supply voltage of a power switch device, and
storing information indicative of the undervoltage event in a memory element coupled to a control terminal of the power switch device such that power is supplied to the memory element by a control signal at the control terminal, the control signal controlling switching of the power switch device.

18. The method of claim 17, further comprising delaying closing the power switch device based on the information stored in the memory element.

19. The method of claim 17, further comprising resetting the memory element based on the control signal.

20. The device of claim 17, wherein detecting the undervoltage event comprises comparing a floating ground derived from the supply voltage to a bandgap reference voltage derived from the supply voltage.

* * * * *